US006322934B1

United States Patent
Cuthbert et al.

(10) Patent No.: US 6,322,934 B1
(45) Date of Patent: Nov. 27, 2001

(54) METHOD FOR MAKING INTEGRATED CIRCUITS INCLUDING FEATURES WITH A RELATIVELY SMALL CRITICAL DIMENSION

(75) Inventors: John David Cuthbert; Feng Jin, both of Orlando, FL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/409,115

(22) Filed: Sep. 30, 1999

(51) Int. Cl.$^7$ .................................................. G03F 9/00
(52) U.S. Cl. .................................................. 430/5
(58) Field of Search ................. 430/5, 322, 22; 716/19, 21

(56) References Cited

U.S. PATENT DOCUMENTS

| 5,532,114 | 7/1996 | Bae ......................................... 430/312 |
| 5,811,222 | 9/1998 | Gardner et al. ....................... 430/312 |
| 5,905,020 | 5/1999 | Hu et al. ............................... 430/394 |
| 6,110,647 | * 8/2000 | Inoue et al. ............................... 430/5 |

* cited by examiner

Primary Examiner—S. Rosasco

(57) ABSTRACT

A method is for making an integrated circuit on a semiconductor wafer, where the integrated circuit includes circuit features having a desired, relatively small, critical dimension. The method preferably comprises the steps of: designing a reticle including pattern features having a critical dimension to form corresponding circuit features based upon overlap areas defined by a plurality of exposure steps with a shift therebetween so that the circuit features have the desired, relatively small, critical dimension. The designing step preferably includes determining a scaling factor function for relating the critical dimension of the pattern features and the shift to the desired critical dimension of the circuit features and while taking into account that the scaling factor function is also a function of the shift. The method preferably includes steps of fabricating the reticle and using the reticle to make the integrated circuit on the semiconductor wafer based on the plurality of exposure steps. The present invention recognizes that the scaling factor is not a single number, but instead is a non-linear function which is also based upon the shift between exposure steps.

29 Claims, 4 Drawing Sheets

METHOD FOR MAKING INTEGRATED CIRCUITS INCLUDING FEATURES WITH A RELATIVELY SMALL CRITICAL DIMENSION

FIELD OF THE INVENTION

The present invention relates to the field of semiconductors, and, more particularly, to a method for making integrated circuits on a semiconductor wafer.

BACKGROUND OF THE INVENTION

Integrated circuits are widely used in electronic devices, such as computers, cellular telephones, entertainment systems, etc. A typical integrated circuit includes a semiconductor substrate with a plurality of active regions formed therein. These active regions may be interconnected by various conductive or metal lines formed in layers on the substrate. Accordingly, an integrated circuit may include millions of transistors, for example.

As the densities of integrated circuits are continually increased, each feature, such as the width of a metal line, or the width of a polygate oxide layer, is continually reduced. Smaller features permit faster operation, less power consumption and more complicated functions to be performed. Such features are typically defined by selective exposure of a photoresist layer on a semiconductor wafer to a pattern imaged from a mask or reticle in a process generally known as optical lithography or photolithography. The exposed photoresist layer portions may be made etch resistant upon exposure to the image, for example. The non-exposed portions may then be removed leaving the desired photoresist pattern. The chemistry of the photoresist may also provide that exposed portions are etched and non-exposed portions remain. The remaining resist portions are then typically used to provide selective etching of the underlying integrated circuit portions.

The resolution and hence minimum feature size is related to the wavelength of light used in the photolithography. The so-called Rayleigh resolution criteria will soon define the limit of physics for imaging the ever-shrinking feature size in integrated circuit manufacturing. Continuing developments have allowed optical lithography to keep pace with decreasing feature sizes. As noted in the IEEE Spectrum article "Ultralight lithography" appearing at pp. 35–40, in July 1999, the lifetime of a given lithography generation is modified until a complete change to a next generation technology is made. In other words, various corrective measures are taken to help pattern smaller features, and which is limited by the wavelength of light used. Typical corrective techniques include optical proximity correction (OPC) and the use of phase-shift masks. Unfortunately, such phase-shift masks and OPC masks can be relatively expensive.

One possible alternative is to use successive printing or exposure steps, wherein a shift is performed between successive exposures as disclosed in U.S. Pat. Nos. 5,905,020 to Hu et al. and 5,811,222 to Gardner et al., for example. The Hu et al. patent in particular recognizes that to achieve a precise critical dimension, it was necessary to adjust the magnitude of the positional shift to account for process factors, such as the contrast of the photoresist and the degree of photoresist swelling during development. This compensation factor for a given process is described as being empirically determined based upon the critical dimension sought. In most cases this compensation factor fell within a range of 0.8 to 1.8.

Unfortunately, as circuit feature sizes are yet further reduced the overlap printing approach is useful, but may produce inaccurate features. This is so because only a constant scalar compensation factor is used. In many applications, the constant scalar compensation factor produces unacceptable results.

SUMMARY OF THE INVENTION

In view of the foregoing background, it is therefore an object of the present invention to provide a method for making integrated circuits having smaller feature sizes.

It is another object of the invention to provide a method for making integrated circuits having smaller feature sizes, based upon the overlap or shifted exposure approach and while accurately producing the small circuit features.

These and other objects, features and advantages in accordance with the present invention are provided by a method for making an integrated circuit on a semiconductor wafer, where the integrated circuit includes circuit features having a desired, relatively small, critical dimension. The method preferably comprises the steps of: designing a reticle including pattern features having a critical dimension to form corresponding circuit features based upon overlap areas defined by a plurality of exposure steps with a shift therebetween so that the circuit features have the desired, relatively small, critical dimension. Moreover, the designing step preferably includes determining a scaling factor function for relating the critical dimension of the pattern features and the shift to the desired critical dimension of the circuit features and while taking into account that the scaling factor function is also a function of the shift. The method also preferably includes the steps of fabricating the reticle and using the reticle to make the integrated circuit on the semiconductor wafer based on the plurality of exposure steps. The present invention recognizes that the scaling factor is not a single number, but instead is a non-linear function which is also based upon the shift between exposure steps.

The step of determining preferably comprises empirically determining the scaling factor function. The scaling factor function is also typically a function of a photolithography tool using the reticle, the tool's settings and a photoresist on the semiconductor wafer. Of course, the photoresist layer is applied on the semiconductor wafer and the reticle is used to selectively expose the photoresist layer. After exposure portions of the photoresist layer are removed.

The invention is particularly advantageous where the integrated circuit includes circuit features for gates of at least some relatively fast MOS transistors. Such relatively small features have been made using a second phase shift reticle in the past. However, the present invention obviates the need for the second relatively expensive phase shift reticle and the additional processing steps for using the phase shift reticle. In other words, the integrated circuit may include circuit features for fast MOS transistors and slow MOS transistors, and wherein the reticle is used for both the fast and slow MOS transistors in accordance with the invention.

The integrated circuit preferably includes circuit features that are generally rectangular in shape or have a shape based on a combination of rectangles. For such features, the shift between exposing steps is preferably in a diagonal direction.

Another method aspect of the invention is for defining circuit features having a desired, relatively small, critical dimension on a semiconductor wafer. The method preferably comprises designing a reticle including pattern features having a critical dimension to form corresponding circuit features based upon overlap areas defined by a plurality of exposure steps with a shift therebetween so that the circuit features have the desired, relatively small, critical dimension. The designing step preferably includes empirically determining a scaling factor function for relating the critical dimension of the pattern features and the shift to the desired critical dimension of the circuit features and while taking into account that the scaling factor function is also a function of the shift. The method also preferably includes the steps of fabricating the reticle, coating the semiconductor wafer with a layer of photoresist, and using the reticle for the plurality of exposure steps with the shift therebetween.

Yet another method aspect of the invention is directed to a method for designing a reticle. The reticle includes pattern features having a critical dimension to form corresponding circuit features in an integrated circuit on a semiconductor wafer based upon overlap areas defined by a plurality of exposure steps with a shift therebetween so that the circuit features have desired, relatively small, critical dimension. This method preferably comprises the step of: determining a scaling factor function for relating the critical dimension of the pattern features and the shift to the desired critical dimension of the circuit features and while taking into account that the scaling factor function is also a function of the shift.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
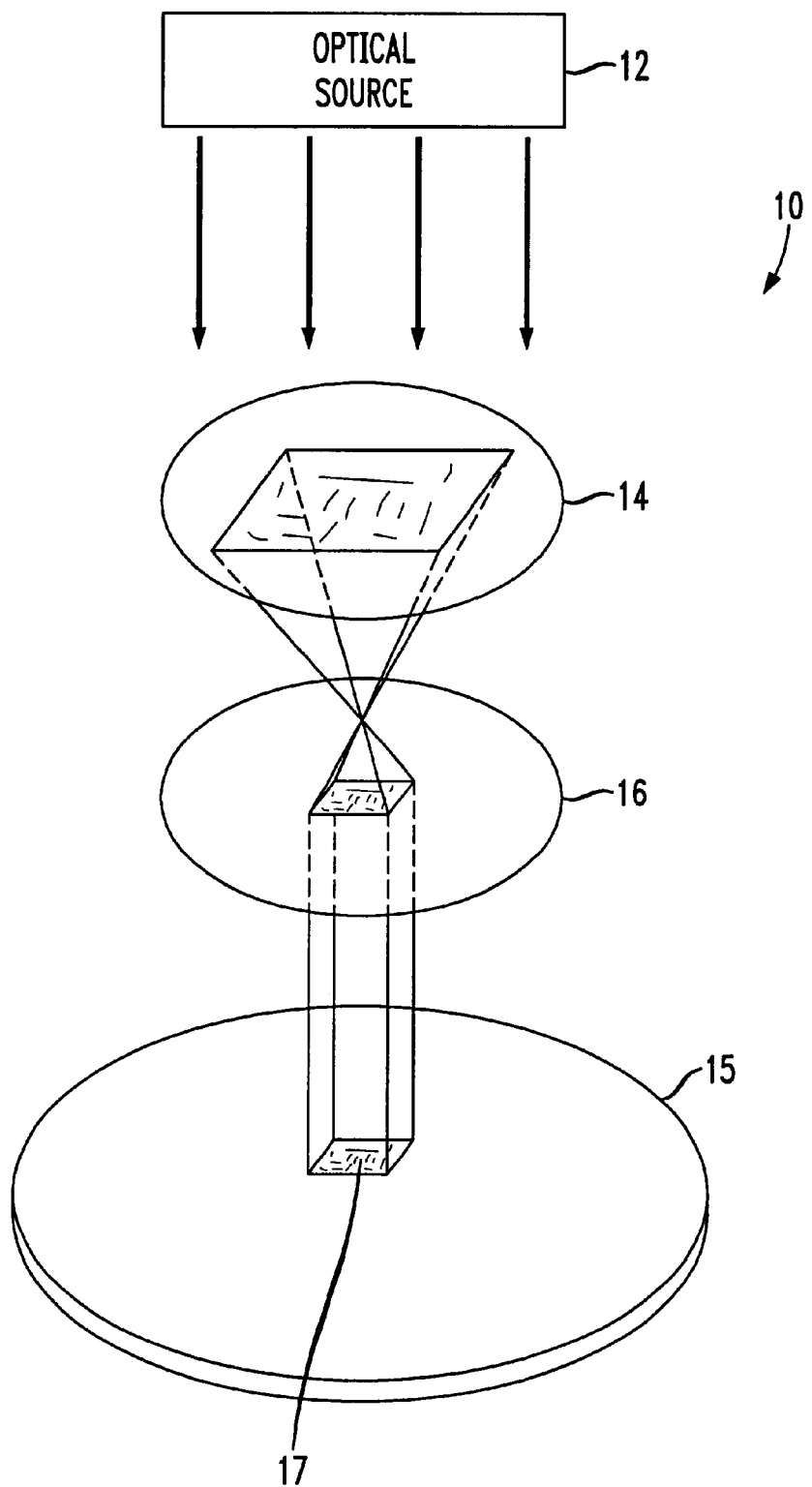
FIG. 1 is a simplified schematic diagram of a photolithography tool using the reticle made in accordance with the present invention.

The present invention relates to a method for making integrated circuits including relatively small circuit features having, in turn, a relatively small critical dimension. Referring initially to FIG. 1, an optical lithography system 10 is described which advantageously uses the method of the present invention. The system 10 illustratively includes an optical source 12 which generates light directed toward and through the illustrated reticle 14. The reticle 14 includes pattern features thereon which will be optically transferred to the surface of the semiconductor wafer 15 as will be readily appreciated by those skilled in the art. A lens system 16 is schematically illustrated in the optical path from the reticle 14 to the wafer 15.

Those of skill in the art will appreciate that other similar and more complicated arrangements of optical elements may be used to transfer the pattern of reticle 14 onto the wafer 15. Only a single image 17 for a corresponding single integrated circuit is shown in the illustrated embodiment, although those of skill in the art will appreciate that multiple images may be formed simultaneously or sequentially. In addition, those of skill in the art will recognize that the wafer 15 may be supported on a precisely movable stage. Accordingly, the stage and wafer may be moved relative to the incident light in a stepping fashion to thereby print or expose other portions of the wafer to form other integrated circuits. This stepping feature is used in the present invention to provide multiple exposures or printings which are shifted in position relative to one another. Accordingly, smaller device feature sizes may be formed than would otherwise be possible using a single exposure.

As noted above in the Background of the Invention, it is generally desired to be able to print smaller and smaller features. Of course, ways to do so include reducing the wavelength of the light and increasing the numerical aperture of the optical elements. This generally requires the development of a next generation of lithography tools. Other techniques have also been proposed to extend the usefulness of current lithography tools. For example, phase shift reticles are used for some applications, but are typically considerably more expensive than conventional reticles.

Some circuits require relatively small gates in addition to larger gates. The smaller gates are typically for so-called fast gate MOS transistors as will be appreciated by those skilled in the art. One approach to forming both the fast and slow gate transistors is to use a conventional single exposure and reticle for the slow gates and other features, while the fast gates are formed using a phase shift reticle. The phase shift reticles are relatively expensive and multiple exposure steps using different reticles complicate the process.

An alternate approach to obtain smaller feature sizes from existing photolithography tools is described in U.S. Pat. Nos. 5,905,020 to Hu et al. and 5,811,222 to Gardner et al., for example, both of which are incorporated herein in their entirety by reference. The patents described successive printing or exposure steps, wherein a shift is performed between successive exposures. The Hu et al. patent recognizes that it was necessary to adjust the positional shift to account for process factors, such as the contrast of the photoresist and the degree of photoresist swelling during development. However, Hu et al. describes only a scalar factor for such compensation. This scalar factor is not sufficient for many applications, as it is not accurate enough to produce the desired small circuit features.

Figure 2:
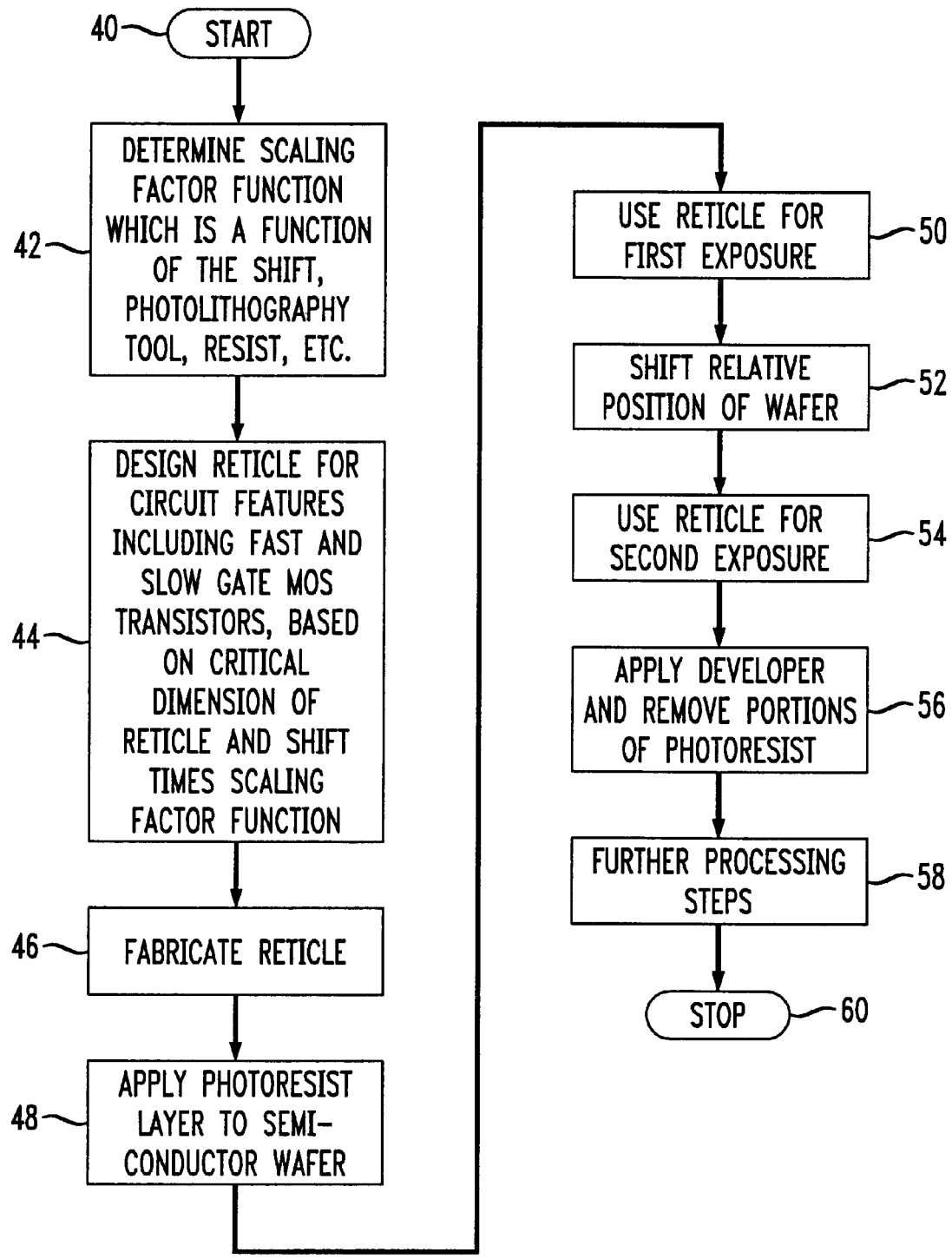
FIG. 2 is a flow chart illustrating a method in accordance with the present invention.
Figure 3:
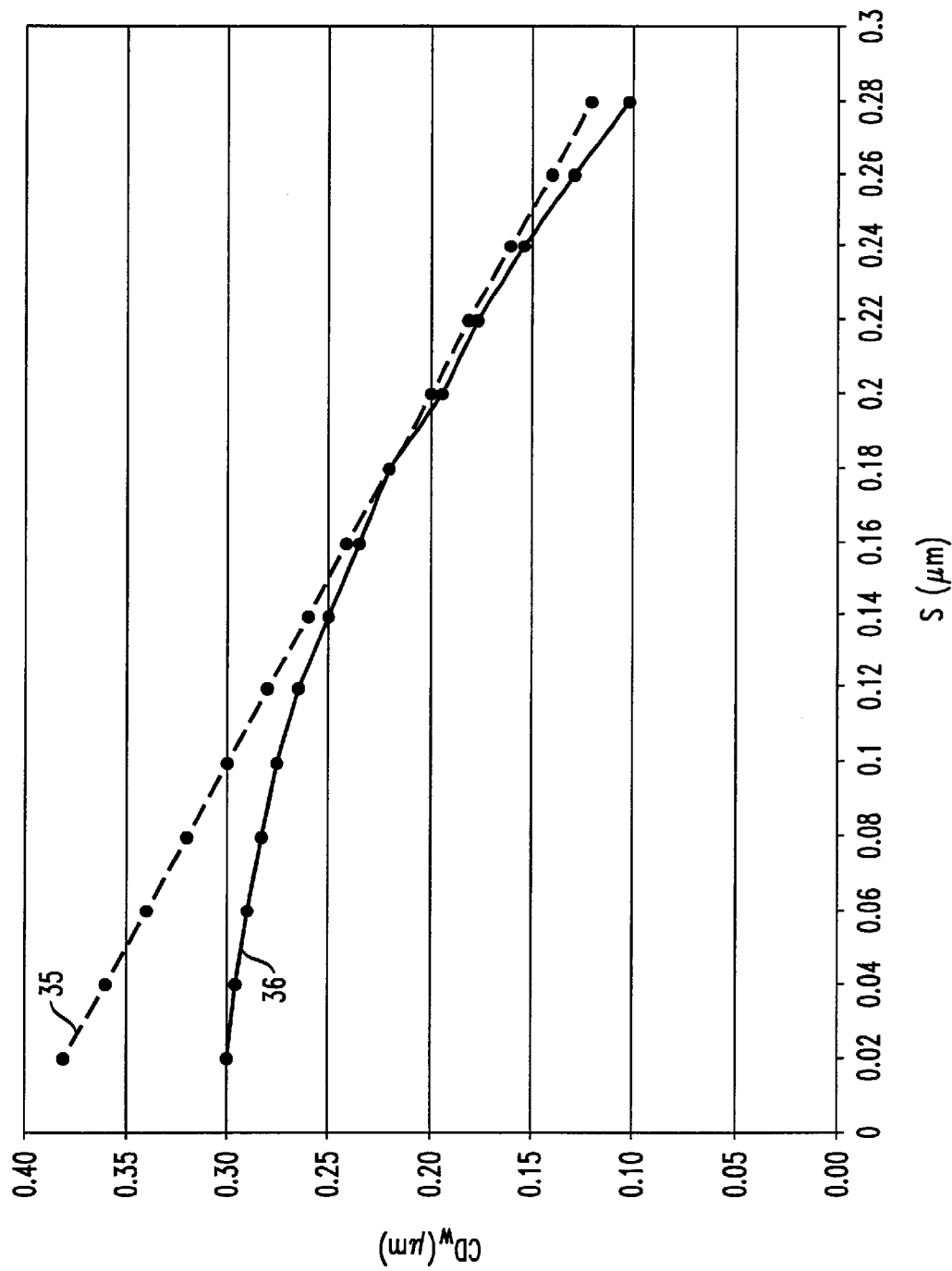
FIG. 3 is a graph having a first plot of the expected theoretical critical dimension of the circuit feature versus the critical dimension of the pattern feature based upon a constant scaling factor as in the prior art, and a second plot illustrating the actual critical dimension of the circuit feature versus the critical dimension of the pattern feature based upon the non-linear scaling factor function in accordance with the present invention.
Figure 4:
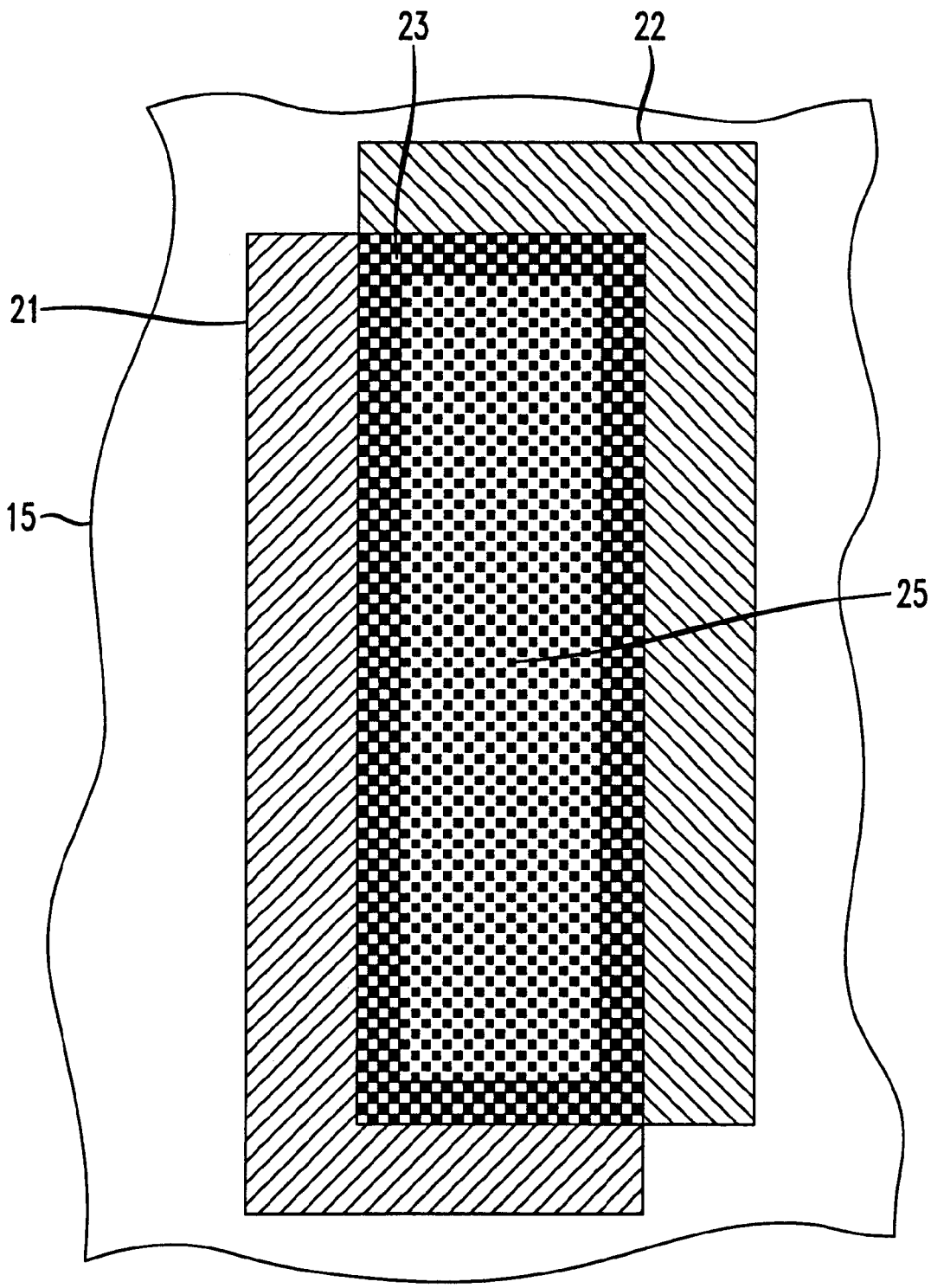
FIG. 4 is a greatly enlarged schematic plan view of an integrated circuit feature and illustrating the double exposure approach in accordance with the present invention.

Turning now additionally to FIGS. 2–4 the method of the present invention is now further described. One method of the invention is for making an integrated circuit having the relatively small feature sizes which are below the Rayleigh limit of a single exposure or printing. In particular, from the start (Block 40) the scaling factor function is first determined. This scaling factor function is used to multiply the critical dimension of the reticle minus the shift to generate the critical dimension that will be produced on the photoresist layer. This function also desirably takes into account the photolithography tool being used including its settings, properties of the photoresist, and may also include etching effects.

What has not been realized to applicants knowledge before, is that the scaling factor is also a function of the shift. By including the shift in determining the scaling factor function, considerably improved and consistent results may be obtained.

A representative plot of a scaling factor function is given by the plot 36 of FIG. 3. It can readily be seen that the plot 36 represents a nonlinear function of the critical dimension of the circuit feature (Cdw) versus the shift (S). The dashed plot labeled with reference numeral 35 represents a theoretical calculated relationship between the shift and the critical dimension of the circuit feature based upon a known critical dimension of the reticle (CDr) and without recognizing that the critical dimension of the circuit feature is also related to the shift. The plot 36 is representative of an actual empirically determined scaling factor function based upon a Nikon stepper/scanner system.

At Block 44, the reticle can be designed taking into account the critical dimension of the reticle and the shift to produce a desired critical dimension of circuit features. For example, features such as the gates for fast MOS transistors and slow MOS transistors can be designed. Accordingly, the reticle 14 can be conventional and does not need phase shifting capability, for example, as was used in the past to create the smaller fast gates as will be appreciated by those skilled in the art.

At Block 46 the reticle 14 (FIG. 1) is fabricated using conventional techniques as will also be readily understood by those skilled in the art. At Block 48 a layer of photoresist is spun coated onto the wafer 15. The reticle 14 is then used for a first exposure or printing (Block 50). Turning specifically to FIG. 4, this first printing produces a generally rectangular image 21 shown by the right diagonal hatch lines. At Block 52 the wafer 15 is shifted at a diagonal upward and toward the right, and at Block 54 a second exposure or printing is performed. This second exposure produces the image 22 indicated by the left diagonal hatch lines. Of course, the overlap area between the two printings creates the smaller circuit feature than could otherwise be produced by a single conventional printing.

The photoresist layer may then be developed (Block 56) by application of a suitable developer, and portions of the photoresist are then selectively removed. As will be appreciated by those skilled in the art, the photoresist portion that remains is somewhat less than the overlap area in the illustrated embodiment. This is more clearly seen in FIG. 4, where the interior overlap rectangle 25 remains, but the overlap frame 23 is removed.

At Block 58 further processing steps may be performed, such as etching, for example, using the remaining photoresist portions as a mask, before stopping (Block 60). The circuit feature thus defined in the semiconductor wafer 15 may correspond directly or by some scale factor to the size of the photoresist portion 25 which remains as will be understood by those skilled in the art.

In summary one method aspect of the present invention is directed to making an integrated circuit on a semiconductor wafer 15, where the integrated circuit includes circuit features having a desired, relatively small, critical dimension. The method preferably comprises the steps of: designing a reticle 14 including pattern features having a critical dimension to form corresponding circuit features based upon overlap areas defined by a plurality of exposure steps with a shift therebetween so that the circuit features have the desired, relatively small, critical dimension. The designing step preferably includes determining a scaling factor function for relating the critical dimension of the pattern features and the shift to the desired critical dimension of the circuit features and while taking into account that the scaling factor function is also a function of the shift. The method also preferably includes steps of fabricating the reticle 14 and using the reticle to make the integrated circuit on the semiconductor wafer 15 based on the plurality of exposure steps. The present invention recognizes that the scaling factor is not a single number, but instead is a non-linear function which is also based upon the shift between exposure steps.

The step of determining preferably comprises empirically determining the scaling factor function. The scaling factor function is also typically a function of a photolithography tool using the reticle, and a photoresist on the semiconductor wafer. The invention is particularly advantageous where the integrated circuit includes circuit features for gates of at least some relatively fast MOS transistors.

Another method aspect of the invention is for defining circuit features having a desired, relatively small, critical dimension on a semiconductor wafer 15. The method preferably comprises designing a reticle 14 including pattern features having a critical dimension to form corresponding circuit features based upon overlap areas defined by a plurality of exposure steps with a shift therebetween so that the circuit features have the desired, relatively small, critical dimension. The designing step preferably includes empirically determining a scaling factor function for relating the critical dimension of the pattern features and the shift to the desired critical dimension of the circuit features and while taking into account that the scaling factor function is also a function of the shift. The method also preferably includes the steps of fabricating the reticle, coating the semiconductor wafer with a layer of photoresist, and using the reticle 14 for the plurality of exposure steps with the shift therebetween.

Another method aspect of the invention is directed to a method for designing a reticle 14. The reticle 14 includes pattern features having a critical dimension to form corresponding circuit features in an integrated circuit on a semiconductor wafer 15 based upon overlap areas defined by a plurality of exposure steps with a shift therebetween so that the circuit features have desired, relatively small, critical dimension. This method preferably comprises the step of determining a scaling factor function for relating the critical dimension of the pattern features and the shift to the desired critical dimension of the circuit features and while taking into account that the scaling factor function is also a function of the shift.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method for making an integrated circuit on a semiconductor wafer, the integrated circuit including circuit features having a desired, relatively small, critical dimension, the method comprising the steps of:

designing a reticle including pattern features having a critical dimension to form corresponding circuit features based upon overlap areas defined by a plurality of exposure steps with a shift therebetween so that the circuit features have the desired, relatively small, critical dimension;

the designing step including determining a scaling factor function for relating the critical dimension of the pattern features and the shift to the desired critical dimension of the circuit features and while taking into account that the scaling factor function is also a function of the shift; and fabricating the reticle and using the reticle to make the integrated circuit on the semiconductor wafer based on the plurality of exposure steps.

2. A method according to claim 1 wherein the step of determining comprises empirically determining.

3. A method according to claim 1 wherein the scaling factor function is a non-linear function.

4. A method according to claim 1 wherein the scaling factor function is also a function of a photolithography tool using the reticle.

5. A method according to claim 1 wherein the scaling factor function is also a function of a photoresist on the semiconductor wafer.

6. A method according to claim 1 wherein the step of using the reticle comprises applying a photoresist layer on the semiconductor wafer and using the reticle to selectively expose the photoresist layer.

7. A method according to claim 6 further comprising the step of removing portions of the photoresist layer after the exposing.

8. A method according to claim 1 wherein the integrated circuit includes circuit features for gates of at least some relatively fast MOS transistors.

9. A method according to claim 1 wherein the integrated circuit includes circuit features for fast MOS transistors and slow MOS transistors; and wherein the reticle is used for both fast and slow MOS transistors.

10. A method according to claim 1 wherein the integrated circuit includes circuit features that are generally rectangular in shape; and wherein the shift between exposing steps is in a diagonal direction.

11. A method according to claim 1 wherein the reticle is devoid of phase shifting portions.

12. A method for defining circuit features having a desired, relatively small, critical dimension on a semiconductor wafer, the method comprising the steps of:

designing a reticle including pattern features having a critical dimension to form corresponding circuit features based upon overlap areas defined by a plurality of exposure steps with a shift therebetween so that the circuit features have the desired, relatively small, critical dimension;

the designing step including empirically determining a scaling factor function for relating the critical dimension of the pattern features and the shift to the desired critical dimension of the circuit features and while taking into account that the scaling factor function is also a function of the shift;

fabricating the reticle;

coating the semiconductor wafer with a photoresist layer; and using the reticle for the plurality of exposure steps of the photoresist layer with the shift between adjacent exposure steps.

13. A method according to claim 12 wherein the scaling factor function is a non-linear function.

14. A method according to claim 12 wherein the scaling factor function is also a function of a photolithography tool using the reticle.

15. A method according to claim 12 wherein the scaling factor function is also a function of the photoresist layer on the semiconductor wafer.

16. A method according to claim 12 further comprising the step of removing portions of the photoresist layer after the exposing steps.

17. A method according to claim 12 wherein the integrated circuit includes circuit features for gates of at least some relatively fast MOS transistors.

18. A method according to claim 12 wherein the integrated circuit includes circuit features for fast MOS transistors and slow MOS transistors; and wherein the reticle is used for both fast and slow MOS transistors.

19. A method according to claim 12 wherein the integrated circuit includes circuit features that are generally rectangular in shape; and wherein the shift between exposing steps is in a diagonal direction.

20. A method according to claim 12 wherein the reticle is devoid of phase shifting portions.

21. A method for designing a reticle including pattern features having a critical dimension to form corresponding circuit features in an integrated circuit on a semiconductor wafer based upon overlap areas defined by a plurality of exposure steps with a shift therebetween so that the circuit features have desired, relatively small, critical dimension, the method comprising the step of:

determining a scaling factor function for relating the critical dimension of the pattern features and the shift to the desired critical dimension of the circuit features and while taking into account that the scaling factor function is also a function of the shift.

22. A method according to claim 21 wherein the step of determining comprises empirically determining.

23. A method according to claim 21 wherein the scaling factor function is a non-linear function.

24. A method according to claim 21 wherein the scaling factor function is also a function of a photolithography tool using the reticle.

25. A method according to claim 21 wherein the scaling factor function is also a function of a photoresist on the semiconductor wafer.

26. A method according to claim 21 wherein the integrated circuit includes circuit features for gates of at least some relatively fast MOS transistors.

27. A method according to claim 21 wherein the integrated circuit includes circuit features for fast MOS transistors and slow MOS transistors; and wherein the reticle is used for both fast and slow MOS transistors.

28. A method according to claim 21 wherein the integrated circuit includes circuit features that are generally rectangular in shape; and wherein the shift between exposing steps is in a diagonal direction.

29. A method according to claim 21 wherein the reticle is devoid of phase shifting portions.

* * * * *